(12) United States Patent
Kim et al.

(10) Patent No.: US 7,981,720 B2
(45) Date of Patent: Jul. 19, 2011

(54) METHOD OF MAKING THIN FILM TRANSISTOR WITH ZINC OXIDE BASED SEMICONDUCTOR LAYER AND ZINC OXIDE BASED INSULATION LAYER

(75) Inventors: Dae-Won Kim, Gyeonggi-Do (KR); Jong-Uk Bae, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/648,872

(22) Filed: Dec. 29, 2009

(65) Prior Publication Data

US 2010/0304528 A1    Dec. 2, 2010

(30) Foreign Application Priority Data

Jun. 2, 2009  (KR) .................. 10-2009-0048770

(51) Int. Cl.
 H01L 21/00 (2006.01)
 H01L 21/36 (2006.01)
(52) U.S. Cl. ......... 438/104; 438/151; 438/482; 438/483
(58) Field of Classification Search .................. None
See application file for complete search history.

(56) References Cited

U.S. PATENT DOCUMENTS

| | | | | |
|---|---|---|---|---|
| 2006/0244107 A1* | 11/2006 | Sugihara et al. | ............... | 257/646 |
| 2007/0252147 A1* | 11/2007 | Kim et al. | ................. | 257/59 |
| 2007/0272922 A1* | 11/2007 | Kim et al. | ................. | 257/43 |
| 2008/0032444 A1* | 2/2008 | Wu et al. | ................. | 438/104 |
| 2008/0258141 A1* | 10/2008 | Park et al. | ................. | 257/43 |
| 2010/0019239 A1* | 1/2010 | Cheong et al. | ................. | 257/43 |
| 2010/0084649 A1* | 4/2010 | Seo et al. | ................. | 257/43 |
| 2010/0308324 A1* | 12/2010 | Kim et al. | ................. | 257/43 |

* cited by examiner

*Primary Examiner* — Scott B Geyer
(74) *Attorney, Agent, or Firm* — Morgan, Lewis & Bockius LLP (57) ABSTRACT

According to a method of fabricating an oxide thin-film transistor, when a thin-film transistor is fabricated by using an amorphous zinc oxide (ZnO)-based semiconductor as an active layer, it may be possible to reduce a tact time as well as attain an enhanced element characteristic by depositing an insulation layer having an oxide characteristic in-situ through controlling oxygen ($O_2$) flow subsequent to depositing an oxide semiconductor using a sputter, and the method may include the steps of forming a gate electrode on a substrate; forming a gate insulation layer on the substrate; depositing an amorphous zinc oxide-based semiconductor layer made of an amorphous zinc oxide-based semiconductor and an amorphous zinc oxide-based insulation layer having an oxide characteristic in-situ on the gate insulation layer; forming an active layer made of the amorphous zinc oxide-based semiconductor over the gate electrode while at the same time forming a channel protection layer made of the amorphous zinc oxide-based insulation layer on a channel region of the active layer; and forming a source electrode and a drain electrode electrically connected to a source region and a drain region of the active layer over the active layer.

10 Claims, 7 Drawing Sheets

METHOD OF MAKING THIN FILM TRANSISTOR WITH ZINC OXIDE BASED SEMICONDUCTOR LAYER AND ZINC OXIDE BASED INSULATION LAYER

CROSS-REFERENCE TO RELATED APPLICATIONS

Pursuant to 35 U.S.C. §119(a), this application claims the benefit of earlier filing date and right of priority to Korean Application No. 10-2009-0048770 filed on Jun. 2, 2009, the contents of which is incorporated by reference herein in its entirety.

BACKGROUND OF THE INVENTION

1. Field of the Invention

The present invention relates to a method of fabricating an oxide thin-film transistor, and more particularly, to a method of fabricating an oxide thin-film transistor using an amorphous zinc oxide-based semiconductor as an active layer.

2. Description of the Related Art

In recent years, with rising interests in information displays and increasing demands to use portable information media, researches and commercialization of light-weight and thin-profile flat panel displays (FPDs) for substituting traditional displays such as cathode ray tubes (CRTs) have been actively carried out. In particular, among such FPDs, a liquid crystal display (LCD), which is a device displaying images using an optical anisotropy of liquid crystal molecules, has been actively applied to a notebook, a desktop monitor, or the like, because it is excellent in the resolution, color representation, image quality, and the like.

The liquid crystal display device is largely configured with a color filter substrate, an array substrate, and a liquid crystal layer formed between the color filter substrate and the array substrate.

An active matrix (AM) method, which is primarily used for the liquid crystal display device, is a method for driving liquid crystal molecules in a pixel portion thereof using an amorphous silicon thin-film transistor (a-Si TFT) as a switching element.

Hereinafter, the structure of a related art liquid crystal display device will be described with reference to FIG. 1.

Figure 1:
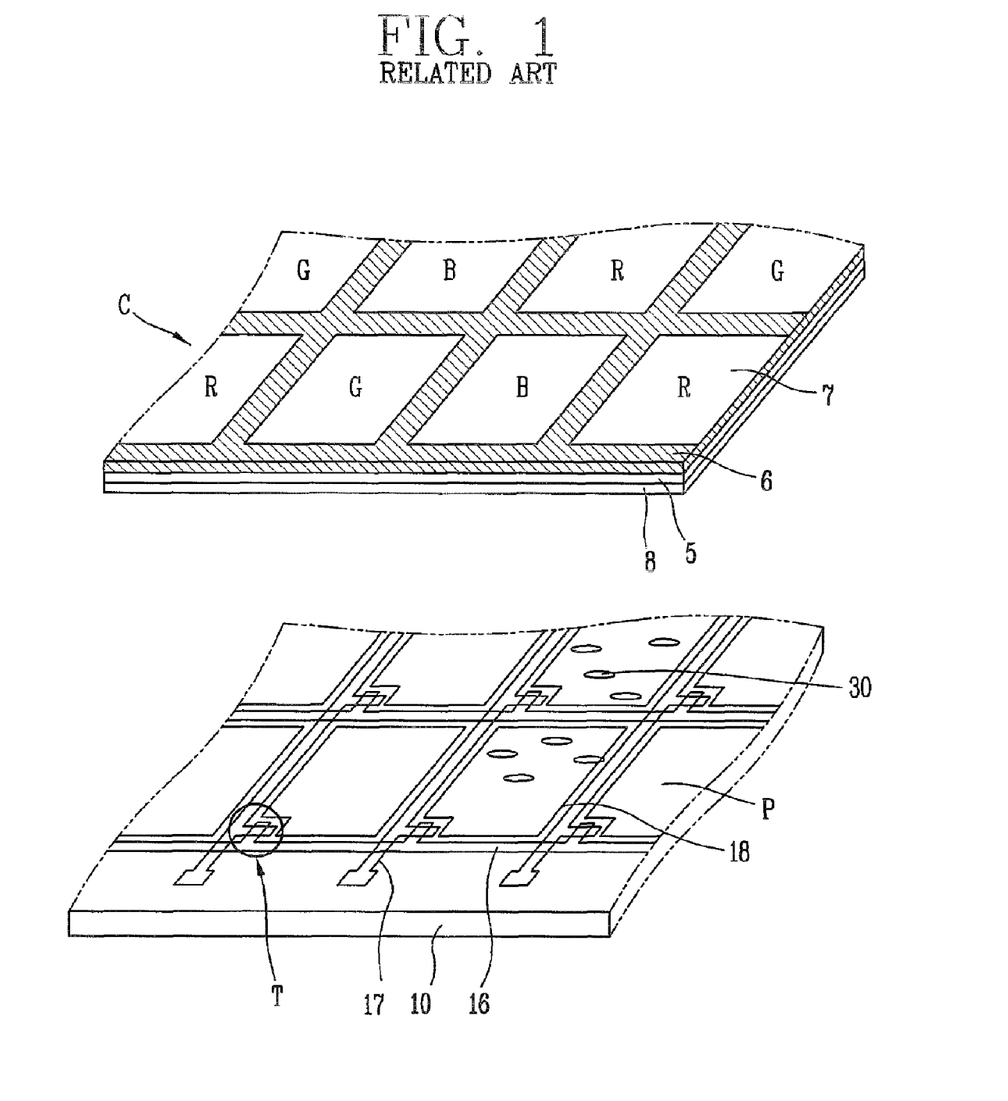
FIG. 1 is an exploded perspective view schematically illustrating a typical liquid crystal display device.

FIG. 1 is an exploded perspective view schematically illustrating a related art liquid crystal display device.

As illustrated in the drawing, the liquid crystal display device may include a color filter substrate 5, an array substrate 10, and a liquid crystal layer 30 formed between the color filter substrate 5 and the array substrate 10.

The color filter substrate 5 may include a color filter (C) configured with a plurality of sub-color filters 7 for implementing red (R), green (G), and blue (B) colors, a black matrix 6 for dividing between the sub-color filters 7 and blocking light passing through the liquid crystal layer, and a transparent common electrode 8 for applying a voltage to the liquid crystal layer 30.

Furthermore, the array substrate 10 may include a plurality of gate lines 16 and data lines 17 arranged vertically and horizontally to define a plurality of pixel regions (P), thin-film transistors (T), which are switching elements formed at each crossing region of the gate lines 16 and the data lines 17, and pixel electrodes 18 formed on the pixel regions (P).

The color filter substrate 5 and the array substrate 10, as described above, are adhered by facing each other by a sealant (not shown) formed at an outside of the image display region to constitute a liquid crystal panel, and an adhesion between the color filter substrate 5 and the array substrate 10 is achieved by an alignment key (not shown) formed on the color filter substrate 5 or the array substrate 10.

However, the foregoing liquid crystal display device has been the most-spotlighted display element due to light-weight and low power consumption, the liquid crystal display device is not a light-emitting element but a light-receiving element and have technical restrictions in brightness, contrast ratio, viewing angle, and the like, and as a result, the development of new display elements for overcoming such disadvantages have been actively carried out.

An organic light-emitting diode (OLED) display, one of the new flat panel displays, is superior to the liquid crystal display in viewing angle, contrast ratio, and the like, because it is a spontaneous light-emitting type, and can be made light-weight and thin-profile and is advantageous in the aspect of power consumption because it requires no backlight. Furthermore, it is advantageous in driving a direct-current low-voltage and having a fast-response speed, and particularly advantageous in the aspect of the fabrication cost.

In recent years, studies on large-sized organic light-emitting displays have been actively carried out, and for the purpose of this application, it is required to develop a transistor for attaining a constant current characteristic in order to have stable operation and durability.

An amorphous silicon thin-film transistor used in the foregoing liquid crystal display device can be fabricated with low-temperature processes but has very low mobility and does not satisfy a constant current bias condition. On the contrary, a multi-crystalline silicon thin-film transistor has high mobility and a satisfactory constant current bias condition whereas it is difficult to make large-sized displays and also required to have high-temperature processes because it is difficult to attain a uniform characteristic.

Due to this, an oxide semiconductor thin-film transistor in which an active layer is formed with an oxide semiconductor has been developed, but it has a problem that the oxide semiconductor thin-film transistor may be damaged and transformed during an etching process of the source/drain electrodes thereof in case of applying the oxide semiconductor to a thin-film transistor having an existing bottom gate structure.

Figure 2:
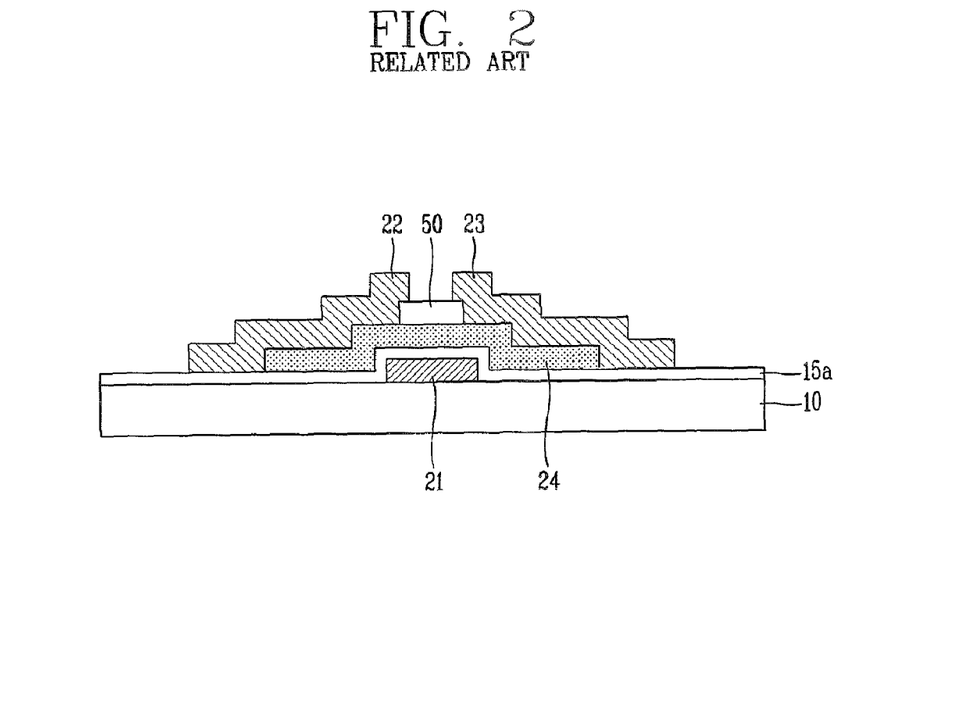
FIG. 2 is a cross-sectional view schematically illustrating the structure of a typical oxide thin-film transistor.

FIG. 2 is a cross-sectional view schematically illustrating the structure of a related art oxide thin-film transistor.

As illustrated in the drawing, a typical oxide thin-film transistor is formed with a gate electrode 21 and a gate insulation layer 15a on the substrate 10, and an active layer 24 made of an oxide semiconductor is formed on the gate insulation layer 15a.

Subsequently, source/drain electrodes 22, 23 for electrically connecting to the source/drain regions of the active layer 24 are formed over the active layer 24.

At this time, the oxide semiconductor constituting the active layer 24 is deposited using a sputter, but during subsequent processes, a back channel region of the active layer 24 will be brought into contact with chemical materials during the photo process or exposed during the dry or wet etching and plasma processes, and the like, and thus the characteristics of the semiconductor thin-film may be changed, thereby deteriorating the element characteristics.

As described above, an oxide semiconductor has a weak coupling structure and thus an etch stopper 50 is additionally formed as a barrier layer over the active layer 24 to prevent the back channel region from being damaged by subsequent processes after depositing the oxide semiconductor, but it has a disadvantage of complicating the process as well as increasing the cost.

In other words, according to the related art, an active layer 24 is formed in the shape of an island through a photo process after depositing an oxide semiconductor and then an insulation layer for forming an etch stopper 50 is deposited. Then, through another photo process, the insulation layer is patterned to form an etch stopper 50.

At this time, since the patterning of the active layer 24 and the deposition of the insulation layer are progressed in a state that the vacuum of the vacuum chamber is released, the oxide semiconductor may be exposed to the air as well as brought into contact with chemical materials while being subject to the photo process, thereby causing the back channel region to be damaged. As a result, the element characteristics are deteriorated, and also a tact time is increased by the movement between chamber devices while depositing the insulation layer.

SUMMARY OF THE INVENTION

The present invention is contrived to solve the aforementioned problem and an object of the invention is to provide a method of fabricating an oxide thin-film transistor using an amorphous zinc oxide-based semiconductor as an active layer.

Another object of the present invention is to provide a method of fabricating an oxide thin-film transistor in which a channel protection layer is formed using a simple process without deteriorating the oxide semiconductor by depositing an insulation layer having an oxide characteristic in-situ through controlling oxygen ($O_2$) flow subsequent to depositing an oxide semiconductor.

Other objects and features of the present invention will be described with reference to the following description of the invention and claims.

In order to accomplish the foregoing object, a method of fabricating an oxide thin-film transistor according to the present invention may include the steps of forming a gate electrode on a substrate; forming a gate insulation layer on the substrate; depositing an amorphous zinc oxide-based semiconductor layer made of an amorphous zinc oxide-based semiconductor and an amorphous zinc oxide-based insulation layer having an oxide characteristic in-situ on the gate insulation layer; forming an active layer made of the amorphous zinc oxide-based semiconductor over the gate electrode while at the same time forming a channel protection layer made of the amorphous zinc oxide-based insulation layer on a channel region of the active layer; and forming a source electrode and a drain electrode electrically connected to a source region and a drain region of the active layer over the active layer.

As described above, according to a method of fabricating an oxide thin-film transistor in accordance with the present invention, an amorphous zinc oxide-based semiconductor is used as an active layer to provide excellent uniformity, thereby providing an effect that can be applied to large-sized displays.

At this time, the foregoing amorphous zinc oxide-based semiconductor may be damaged on a back channel region thereof while performing subsequent processes, but according to a method of fabricating an oxide thin-film transistor in accordance with the present invention, a channel protection layer is formed using a simple process without deteriorating the oxide semiconductor by collectively depositing an insulation layer having an oxide characteristic in-situ within a sputter through controlling oxygen flow subsequent to depositing the oxide semiconductor. As a result, it can provide an effect that the fabrication process and cost thereof are reduced by decreasing the tact time and the number of masks as well as provide an effect of enhancing the element characteristics.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Hereinafter, an oxide thin-film transistor and method thereof according to a preferred embodiment of the present invention will be described in detail with reference to the accompanying drawings.

Figure 3:
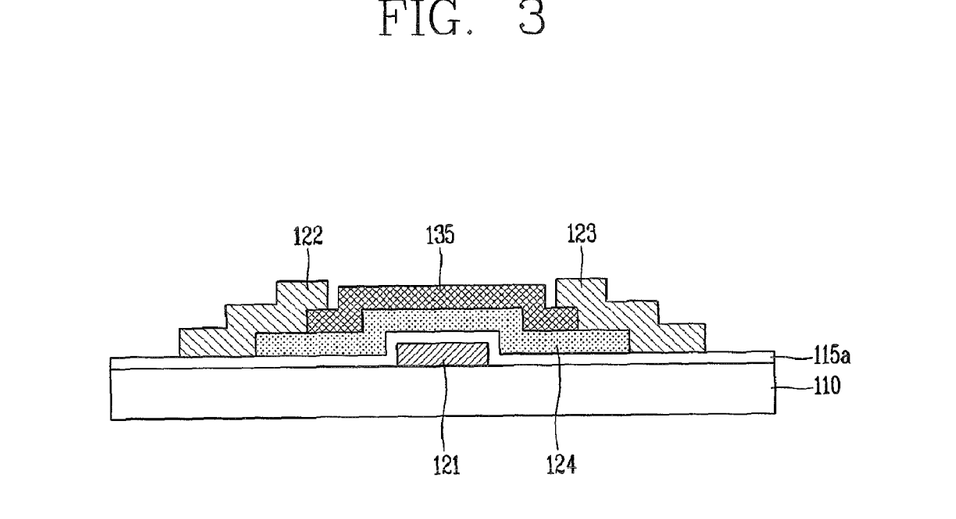
FIG. 3 is a cross-sectional view sequentially illustrating the structure of an oxide thin-film transistor according to the present invention.

FIG. 3 is a cross-sectional view sequentially illustrating the structure of an oxide thin-film transistor according to the present invention, and it schematically illustrates the structure of an oxide thin-film transistor in which an amorphous zinc oxide-based semiconductor is used as an active layer.

As illustrated in the drawing, an oxide thin-film transistor according to the present invention may include a gate electrode 121 formed on a predetermined substrate 110, a gate insulation layer 115a formed on the gate electrode 121, an active layer 124 formed of an amorphous zinc oxide-based semiconductor over the gate electrode 121, and source/drain electrodes 122, 123 electrically connected to the source/drain regions of the active layer 124.

At this time, according to an oxide thin-film transistor in accordance with the present invention, an amorphous zinc oxide-based semiconductor is used to form an active layer, thereby satisfying high mobility and a constant current bias condition as well as providing a uniformity characteristic that can be applied to large-sized displays.

The zinc oxide (ZnO) is a material capable of implementing all three kinds of properties such as conductivity, semi-conductivity, and resistivity based on the oxygen content, and an oxide thin-film transistor in which an amorphous zinc oxide-based semiconductor material is applied to an active layer may be applicable to large-sized displays including liquid crystal display devices and organic light-emitting diode displays.

Furthermore, in recent years, tremendous interests and activities have been concentrated on transparent electronic circuits, but an oxide thin-film transistor in which the amorphous zinc oxide-based semiconductor material is applied to an active layer has high mobility as well as can be fabricated at low temperatures, thereby having an advantage that can be used in the transparent electronic circuits.

In particular, an oxide thin-film transistor according to the present invention is characterized in that an active layer is formed of an a-IGZO semiconductor containing a heavy metal such as indium (In) and gallium (Ga) in the ZnO.

The a-IGZO semiconductor is transparent so as to pass visible light therethrough, and also an oxide thin-film transistor fabricated with the a-IGZO semiconductor has a mobility of 1-100 cm$^2$/Vs, thereby showing a high mobility characteristic compared to that of an amorphous silicon thin-film transistor.

Furthermore, the a-IGZO semiconductor has a wide band gap to fabricate a UV light emitting diode (LED), a white LED, and other components that have a high color purity, and also it has a characteristic that can be processed at low temperatures to fabricate a light and flexible product.

Moreover, an oxide thin-film transistor fabricated with the a-IGZO semiconductor shows a uniform characteristic similar to that of an amorphous silicon thin-film transistor, and therefore, the component structure thereof is simple like that of an amorphous silicon thin-film transistor, thereby having an advantage that can be applied to large-sized displays.

According to the oxide thin-film transistor having such a characteristic according to the present invention, a channel protection layer 135 made of a predetermined insulation material is additionally formed between the source electrode 122 and the drain electrode 123 over a channel region of the active layer 124, and the channel protection layer 135 performs a role of protecting a back channel region from being damaged by subsequent processes. In other words, the channel protection layer 135 according to the present invention is formed over a back channel region of the active layer 124, and during subsequent processes, it performs a role of protecting the back channel region of the active layer 124 from being brought into contact with chemical materials during the photo process or exposed during the dry or wet etching and plasma processes, and the like.

In particular, for the channel protection layer 135 according to the present invention, an insulation layer having an oxide characteristic is collectively deposited and formed in-situ within a sputter through controlling oxygen flow subsequent to depositing an oxide semiconductor, thereby forming a channel protection layer using a simple process without deteriorating the oxide semiconductor.

Furthermore, in case of the present invention, the number of masks may be decreased by patterning the active layer 124 and channel protection layer 135 at the same time using the ashing of a photoresist film or using a diffraction mask (hereinafter, a half-tone mask will be included in case of indicating a diffraction mask) for which a diffraction pattern is applied to the source/drain regions of the active layer, thereby reducing the fabrication process and cost thereof, and it will be described in detail through a method of fabricating an oxide thin-film transistor as described below.

Figure 4A:
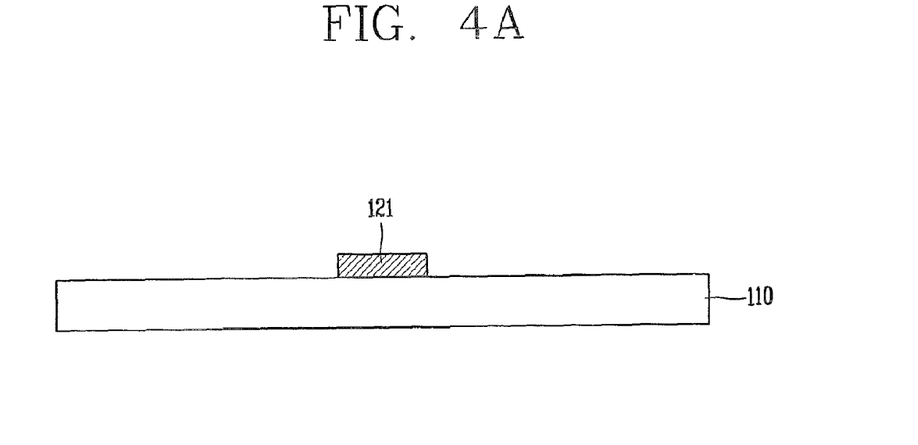
FIGS. 4A through 4C are cross-sectional views schematically illustrating the fabrication process of an oxide thin-film transistor as illustrated in FIG. 3.
Figure 4B:
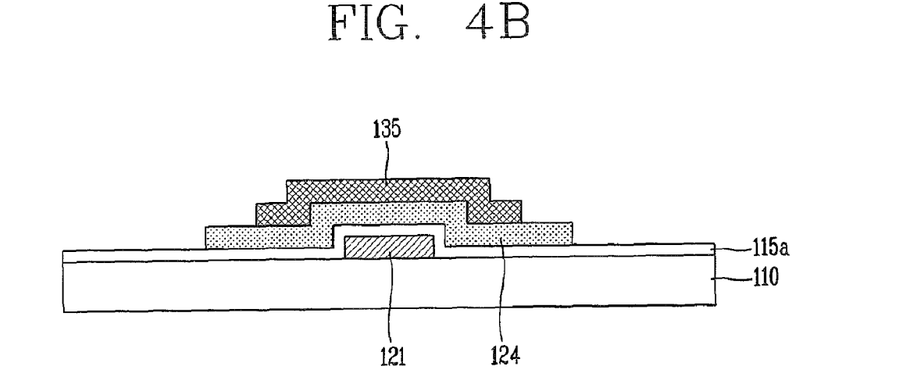
Figure 4C:
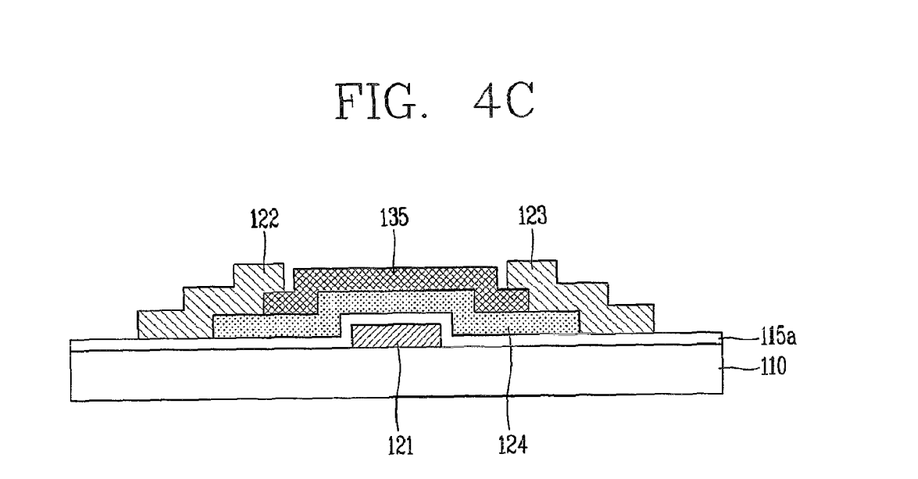

FIGS. 4A through 4C are cross-sectional views schematically illustrating the fabrication process of an oxide thin-film transistor as illustrated in FIG. 3.

As illustrated in FIG. 4A, a predetermined gate electrode 121 is formed on a substrate 110 made of a transparent insulation material.

At this time, an amorphous zinc oxide-based compound semiconductor applied to the oxide thin-film transistor according to the present invention can be deposited at low temperatures, and thus it may be possible to use a substrate 110 applicable to low-temperature processes, such as plastic substrate, sodalime glass, and the like. Furthermore, it shows an amorphous characteristic, and thus it may be also possible to use a substrate 110 for large-sized displays.

Furthermore, the gate electrode 121 is formed by depositing a first conductive film on an entire surface of the substrate 110 and then selectively patterning it through a photolithographic process (first mask process).

Here, low-resistance non-transparent conductive materials may be used for the first conductive film, such as aluminum (Al), aluminum alloy (Al alloy), tungsten (W), copper (Cu), nickel (Ni), chromium (Cr), molybdenum (Mo), titanium (Ti), platinum (Pt), tantalum (Ta), and the like. Furthermore, non-transparent conductive materials may be also used for the first conductive film, such as indium tin oxide (ITO), indium zinc oxide (IZO), and the like, and the conductive material may be formed in a multi-layer structure laminated with two or more of the conductive materials.

Next, As illustrated in FIG. 4B, an insulation layer 115a is formed to cover the gate electrode 121 on an entire surface of the substrate 110.

Then, an amorphous zinc oxide-based semiconductor layer and a predetermined insulation layer are formed on an entire surface of the substrate 110 formed with the insulation layer 115a, and then selectively patterned by using a second mask process of the present invention, thereby forming an active layer 124 made of the amorphous zinc oxide-based semiconductor over the gate electrode 121 while at the same time forming a channel protection layer 135 made of the insulation layer on the active layer 124.

At this time, the amorphous zinc oxide-based semiconductor layer and the predetermined insulation layer are collectively deposited in-situ through controlling oxygen flow within the same sputter, and a channel protection layer is formed through a photoresist film ashing and twice patterning processes or the channel protection layer is formed using a method of first forming an active layer using a diffraction mask for which a diffraction pattern is applied to the source/drain regions thereof and then removing a photoresist film of the source/drain regions through an ashing process, and the second mask process will be described in detail with reference to the drawings as described below.

FIGS. 5A through 5E are cross-sectional views specifically illustrating a second mask process according to a first embodiment of the present invention.

Figure 5A:
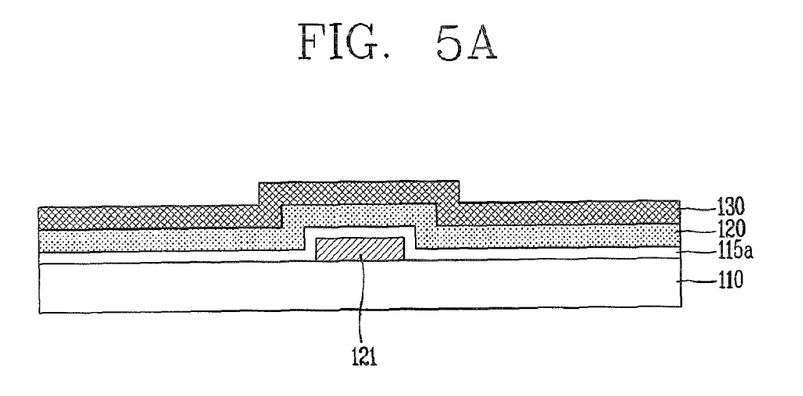
FIGS. 5A through 5E are cross-sectional views specifically illustrating a second mask process according to a first embodiment of the present invention.

As illustrated in FIG. 5A, a insulation layer 115a, which is made of an inorganic insulation film such as a silicon nitride (SiNx) film, a silicon oxide (SiO$_2$) film and the like, or an high-dielectric oxide film such as a hafnium (Hf) oxide, aluminum oxide and the like, is formed on an entire surface of the substrate 110 formed with the gate electrode 121.

At this time, the insulation layer 115a may be formed by a CVD method using a plasma enhanced chemical vapour deposition (PECVD) system or formed by a physical vapour deposition (PVD) method using a sputtering system.

Subsequently, a predetermined amorphous zinc oxide-based semiconductor layer 120 is formed by depositing an amorphous zinc oxide-based semiconductor on an entire surface of the substrate 110 formed with the insulation layer 115a using a sputtering system. Then, a predetermined amorphous zinc oxide-based insulation layer 130 having an oxide characteristic is formed in-situ on the amorphous zinc oxide-based semiconductor layer 120 within the same sputtering system.

At this time, as described above, a zinc oxide may implement all three kinds of properties such as conductivity, semi-conductivity, and resistivity based on the oxygen content, and therefore, the amorphous zinc oxide-based insulation layer 130 having an oxide characteristic can be deposited in-situ through controlling oxygen flow in the substantially same condition subsequent to depositing the amorphous zinc oxide-based semiconductor layer 120.

Here, the amorphous zinc oxide-based compound semiconductor, particularly an a-IGZO semiconductor may be formed by an sputtering method using a complex target such as gallium oxide ($Ga^2O^3$), indium oxide ($In^2O^3$), and zinc oxide (ZnO).

At this time, in case of a first embodiment of the present invention, the amorphous zinc oxide-based semiconductor layer 120 may be formed by using a complex oxide target having an atomic ratio of gallium, indium, and zinc with 1:1:1, 2:2:1, 3:2:1, and 4:2:1 respectively, and particularly, in case of using the complex oxide target having an atomic ratio of gallium, indium, and zinc with 2:2:1, it is characterized in that the equivalent weight ratio of the gallium, indium, and zinc is about 2.8:2.8:1.

Furthermore, according to the oxide thin-film transistor in accordance with a first embodiment of the present invention, a carrier concentration of the active layer thereof may be controlled by controlling an oxygen concentration within the reaction gas during a sputtering process for forming the amorphous zinc oxide-based semiconductor layer 120, and at this time, it may be possible to attain a uniform element characteristic under the condition of an oxygen concentration of 1-10% and a thickness of 500-1000 Å. Furthermore, the amorphous zinc oxide-based semiconductor layer 120 may be formed at a deposition speed within the range of 1-200 Å/sec for a DC or RF sputtering and at an oxygen concentration of 1-40% though they may be varied more or less based on the process conditions, and the amorphous zinc oxide-based insulation layer 130 may be formed at a deposition speed within the range of 1-200 Å/sec for a DC or RF sputtering and at an oxygen concentration of 30-70% though they may be varied more or less based on the process conditions.

Here, the oxygen concentration represents a ratio of the oxygen flow to the sum of the inputted oxygen flow and argon flow.

Figure 5B:
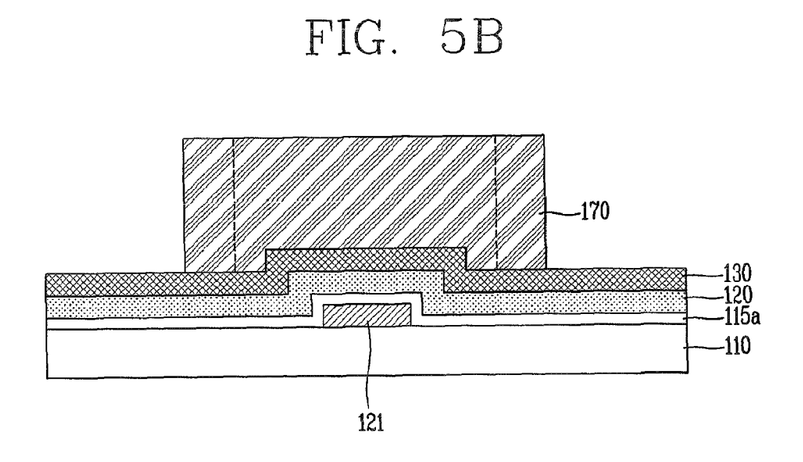

Then, as illustrated in FIG. 5B, a photoresist film made of a photosensitive material such as a photoresist is formed on an entire surface of the substrate 110, and then a predetermined first photoresist film pattern 170 is formed through a second mask process according to a first embodiment of the present invention.

Figure 5C:
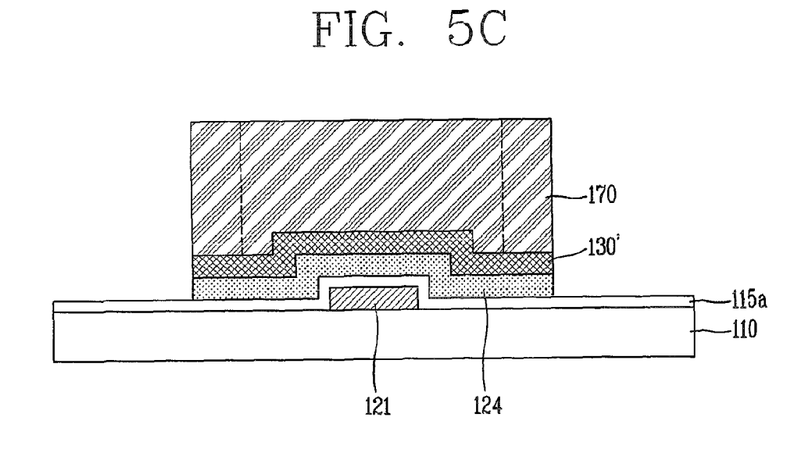

Next, as illustrated in FIG. 5C, when the amorphous zinc oxide-based semiconductor layer and insulation layer formed thereunder are selectively removed by using the first photoresist film pattern 170 formed as described above as a mask, an active layer 124 made of the amorphous zinc oxide-based semiconductor will be formed over a gate electrode 121 of the substrate 110. At this time, an insulation film pattern 130', which is made of the insulation layer and patterned substantially similarly to the active layer 124, will be formed over the active layer 124.

Figure 5D:
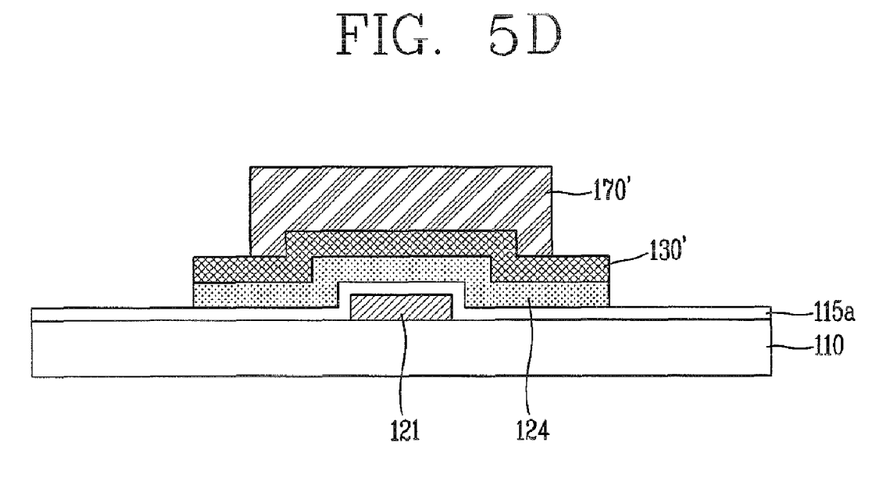

Subsequently, when an ashing process for removing part of the first photoresist film pattern 170 is performed, a predetermined second photoresist film pattern 170' will be formed on the insulation film pattern 130' as illustrated in FIG. 5D.

At this time, as part of the width and thickness thereof is removed through the ashing process, the second photoresist film pattern 170' remains on the channel region in a form that a width of the second photoresist film pattern 170' is reduced that that of the first photoresist film pattern.

Figure 5E:
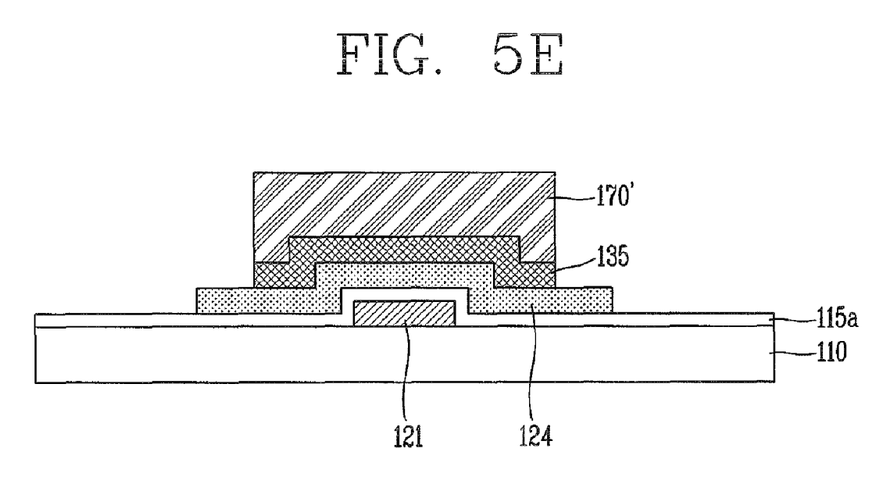

Subsequently, as illustrated in FIG. 5E, a channel protection layer 135 made of the insulation layer is formed on the substrate 110 by selectively removing part of the insulation film pattern using the remaining second photoresist film pattern 170' as a mask.

Next, as illustrated in FIG. 4C, a second conductive film is formed on an entire surface of the substrate 110 formed with the active layer 124 and the channel protection layer 135.

At this time, low-resistance non-transparent conductive materials may be used for the second conductive film, such as aluminum, aluminum alloy, tungsten, copper, nickel, chromium, molybdenum, titanium, platinum, tantalum, and the like.

Furthermore, non-transparent conductive materials may be also used for the first conductive film, such as indium tin oxide, indium zinc oxide, and the like, and the conductive material may be formed in a multi-layer structure laminated with two or more of the conductive materials.

Then, a source electrode 122 and a drain electrode 123 electrically connected to the source region and drain region of the active layer 124 are formed by selectively patterning the second conductive film through a photolithographic process (third mask process).

On the other hand, the active layer and channel protection layer may be formed by using a diffraction mask, and it will be described in detail through a second embodiment of the present invention as described below.

FIGS. 6A through 6F are cross-sectional views specifically illustrating a second mask process according to a second embodiment of the present invention.

Figure 6A:
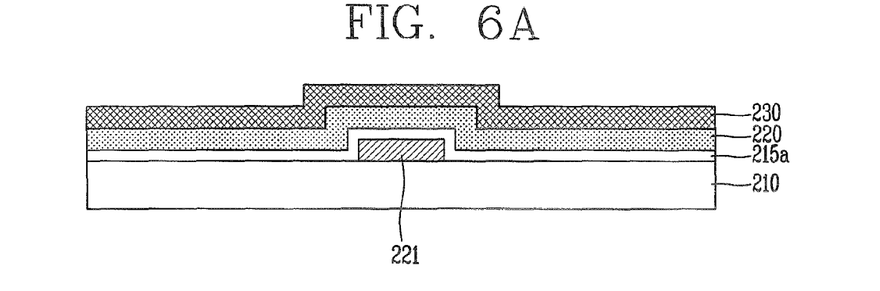
FIGS. 6A through 6F are cross-sectional views specifically illustrating a second mask process according to a second embodiment of the present invention.

As illustrated in FIG. 6A, a insulation layer 215a, which is made of an inorganic insulation film such as a silicon nitride film, a silicon oxide film and the like, or an high-dielectric oxide film such as a hafnium oxide, aluminum oxide and the like, is formed on an entire surface of the substrate 210 formed with the gate electrode 221.

Subsequently, a predetermined amorphous zinc oxide-based semiconductor layer 220 is formed by depositing an amorphous zinc oxide-based semiconductor on an entire surface of the substrate 210 formed with the insulation layer 215a using a sputtering system. Then, a predetermined amorphous zinc oxide-based insulation layer 230 having an oxide characteristic is formed in-situ on the amorphous zinc oxide-based semiconductor layer 220 within the same sputtering system.

At this time, as described in the foregoing first embodiment of the present invention, a zinc oxide may implement all three kinds of properties such as conductivity, semi-conductivity, and resistivity based on the oxygen content, and therefore, the amorphous zinc oxide-based insulation layer 230 having an oxide characteristic can be deposited in-situ through controlling oxygen flow in the substantially same condition subsequent to depositing the amorphous zinc oxide-based semiconductor layer 220.

Furthermore, according to the oxide thin-film transistor in accordance with a second embodiment of the present invention, a carrier concentration of the active layer thereof may be controlled by controlling an oxygen concentration within the reaction gas during a sputtering process for forming the amorphous zinc oxide-based semiconductor layer 220, and at this time, it may be possible to attain a uniform element characteristic under the condition of an oxygen concentration of 1-10% and a thickness of 500-1000 Å. Furthermore, the amorphous zinc oxide-based insulation layer 230 according to a second embodiment of the present invention may be formed at an oxygen concentration of 10-90% though it may be varied more or less based on the process conditions.

Figure 6B:
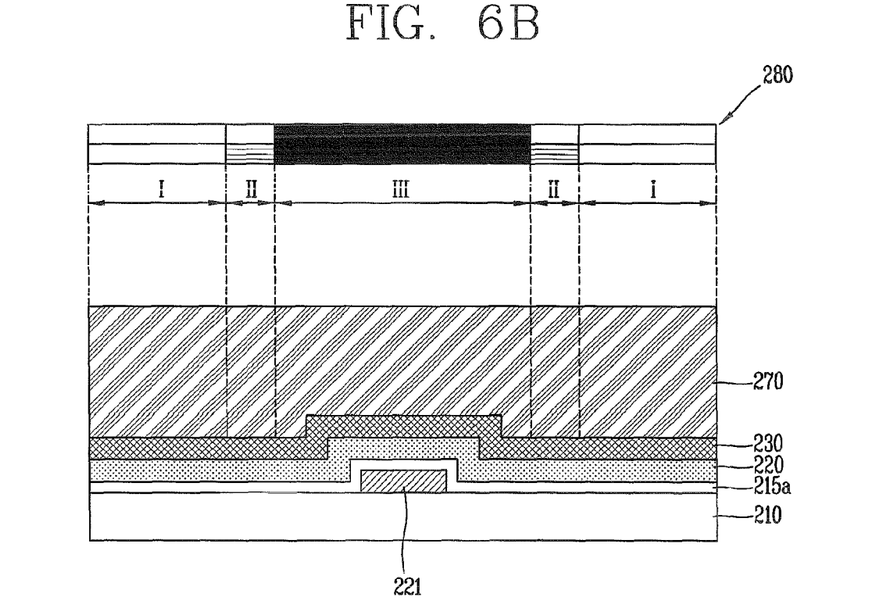

Then, as illustrated in FIG. 6B, a photoresist film 270 made of a photosensitive material such as a photoresist is formed on an entire surface of the substrate 210, and then light is selectively irradiated on the photoresist film 270 through a diffraction mask 280 according to a second embodiment of the present invention.

At this time, the diffraction mask 280 is provided with a first transmission region (I) for transmitting all of the irradiated light, a second transmission region (II) to which a diffraction pattern is applied for transmitting part of the light only but blocking part of the light, and a blocking region (III) for blocking all of the irradiated light, and as a result, light passing through the diffraction mask 280 will be only irradiated to the photoresist film 270.

Figure 6C:
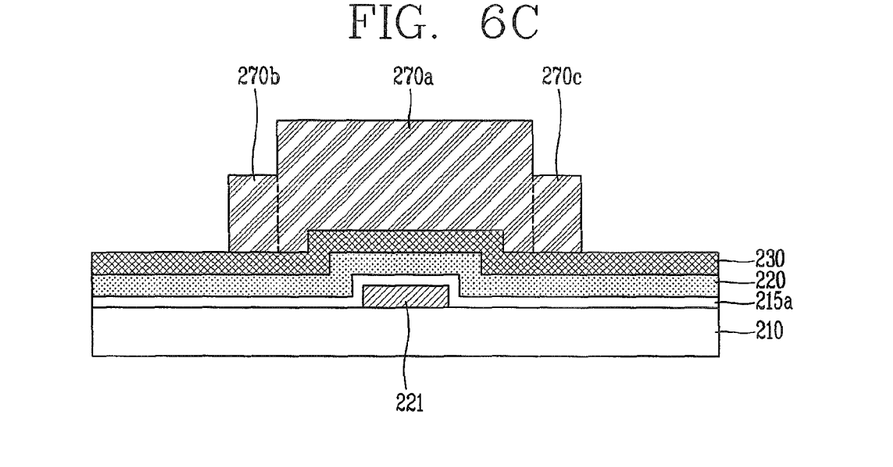

Subsequently, when the exposed photoresist film 270 is developed through the diffraction mask 280, as illustrated in FIG. 6C, a first photoresist film pattern 270a or third photoresist film pattern 270c having a predetermined thickness is remained on a region where all or part of the light is blocked through the blocking region (III) and the second transmission region (II), and the photoresist film is completely removed on the first transmission region (I) where all of the light is transmitted therethrough, thereby exposing a surface of the insulation layer 230.

At this time, a thickness of the first photoresist film pattern 270a formed on the blocking region (III) is formed greater than that of the second photoresist film pattern 270b and third photoresist film pattern 270c that have been formed through the second transmission region (II). Furthermore, the photoresist film is completely removed on a region where all of the light has passed through the first transmission region (I), because it is used a positive-type photoresist, but the present invention is not limited to this and a negative-type photoresist may be allowed to be used.

In particular, in case of a second embodiment of the present invention, it is characterized in that the second transmission region (II) of a diffraction mask according to a second embodiment of the present invention is applied to the source and drain regions of the active layer to be patterned later and the blocking region (III) is applied to the channel region of the active layer.

Figure 6D:
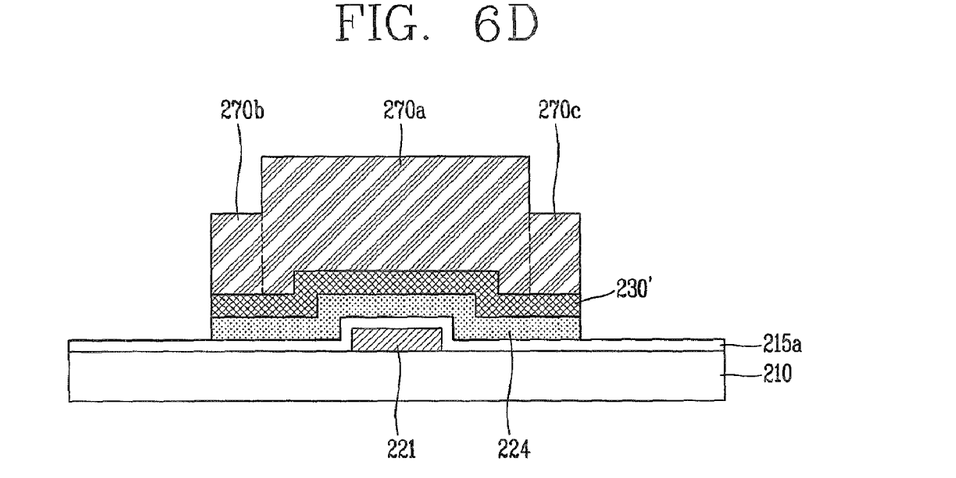

Next, as illustrated in FIG. 6D, when the amorphous zinc oxide-based semiconductor layer and insulation layer formed thereunder are selectively removed by using the first photoresist film pattern 270a through third photoresist film pattern 270c formed as described above as a mask, an active layer 224 made of the amorphous zinc oxide-based semiconductor is formed over a gate electrode 221 of the substrate 210. At this time, an insulation film pattern 230', which is made of the insulation layer and patterned substantially similarly to the active layer 224, is formed over the active layer 224.

Figure 6E:
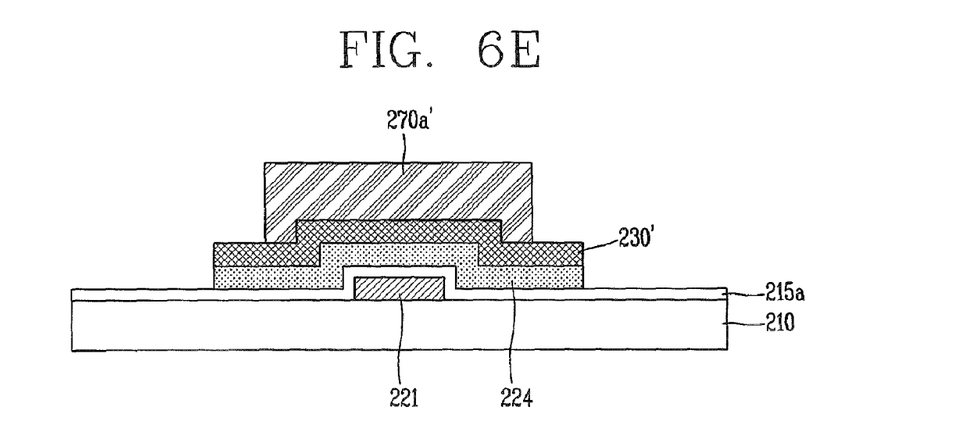

Subsequently, when an ashing process for removing part of the first photoresist film pattern 270a through third photoresist film pattern 270c is performed, the second photoresist film pattern and third photoresist film pattern of the second transmission region (II) will be completely removed as illustrated in FIG. 6E.

At this time, the first photoresist film pattern is a fourth photoresist film pattern 270a' on which the photoresist is removed by as much as a thickness of the second photoresist film pattern and the third photoresist film pattern, and the channel region corresponding to the blocking region (III) is only remained.

Figure 6F:
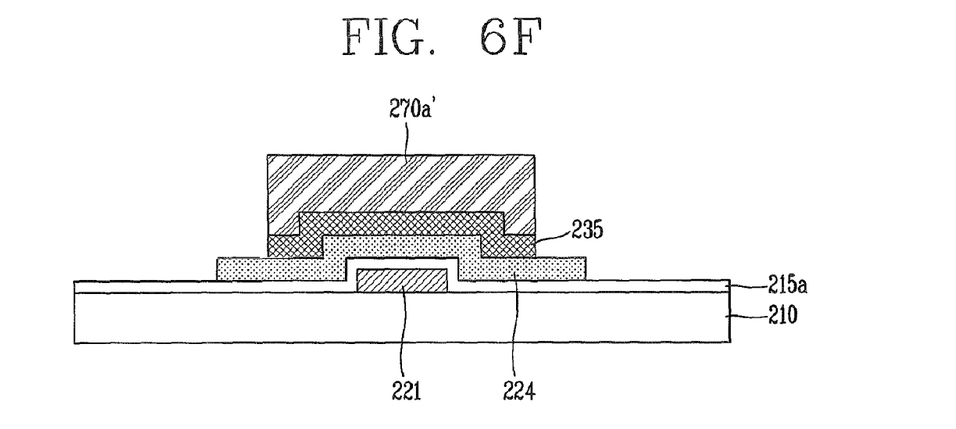

Subsequently, as illustrated in FIG. 6F, a channel protection layer 235 made of the insulation layer is formed on the substrate 210 by selectively removing part of the insulation film pattern using the remaining fourth photoresist film pattern 270a' as a mask.

In this manner, in case of a second embodiment of the present invention, an active layer and a channel protection layer may be formed through one mask process with no additional mask processes by using a diffraction mask for which a diffraction pattern is applied to the source/drain regions thereof.

On the other hand, though not illustrated in the drawing, in case of etching the amorphous zinc oxide-based semiconductor layer and amorphous zinc oxide-based insulation layer at the same time, the source/drain electrodes thereon are brought into contact with a lateral surface of the active layer made of the amorphous zinc oxide-based semiconductor to which its lateral surface is exposed.

As described above, the present invention may be also applicable to an liquid crystal display device as well as other display devices fabricated by using a thin-film transistor, for example, an organic light-emitting diode display device in which organic light-emitting diodes are connected to thin-film transistors.

Furthermore, an amorphous zinc oxide-based semiconductor material having a high mobility and capable of performing low-temperature processes may be applicable to an active layer, thereby having an advantage that can be used for transparent electronic circuits or flexible displays.

Although many subject matters have been specifically disclosed in the foregoing description, they should be construed as an illustration of preferred embodiments rather than a limitation to the scope of invention. Consequently, the invention should not be determined by the embodiments disclosed herein but should be determined by the claims and the equivalents thereof.

What is claimed is:

1. A method of fabricating an oxide thin-film transistor, comprising:
    forming a gate electrode on a substrate;
    forming a gate insulation layer on the substrate;
    depositing an amorphous zinc oxide-based semiconductor layer made of an amorphous zinc oxide-based semiconductor and an amorphous zinc oxide-based insulation layer having an oxide characteristic in-situ on the gate insulation layer;
    forming an active layer made of the amorphous zinc oxide-based semiconductor over the gate electrode while at the same time forming a channel protection layer made of the amorphous zinc oxide-based insulation layer on a channel region of the active layer; and
    forming a source electrode and a drain electrode electrically connected to a source region and a drain region of the active layer over the active layer.

2. The method of fabricating an oxide thin-film transistor of claim 1, wherein the gate electrode, the source electrode, and the drain electrode are formed of a transparent conductive material.

3. The method of fabricating an oxide thin-film transistor of claim 1, wherein the active layer is formed of an α-IGZO semiconductor.

4. The method of fabricating an oxide thin-film transistor of claim 1, wherein the substrate is formed of a glass substrate or a plastic substrate.

5. The method of fabricating an oxide thin-film transistor of claim 1, wherein the amorphous zinc oxide-based semiconductor layer and the amorphous zinc oxide-based insulation layer are formed in-situ by controlling oxygen flow within the same sputtering system.

6. The method of fabricating an oxide thin-film transistor of claim 1, wherein the amorphous zinc oxide-based semiconductor layer may be formed at a deposition speed within the range of 1-200 Å/sec for a DC or RF sputtering and at an oxygen concentration of 1-40% in the reaction gas during a sputtering.

7. The method of fabricating an oxide thin-film transistor of claim 1, wherein the amorphous zinc oxide-based insulation layer may be formed at a deposition speed within the range of 1-200 Å/sec for a DC or RF sputtering and at an oxygen concentration of 30-70% in the reaction gas during a sputtering.

8. The method of fabricating an oxide thin-film transistor of claim 1, wherein the step of forming the active layer and channel protection layer comprises,
- forming a predetermined first photoresist film pattern on a substrate formed with the amorphous zinc oxide-based semiconductor layer and the amorphous zinc oxide-based insulation layer;
- selectively removing the amorphous zinc oxide-based semiconductor layer and insulation layer formed under the first photoresist film pattern using the first photoresist film pattern as a mask to form an active layer made of the amorphous zinc oxide-based semiconductor over the gate electrode, and forming an insulation film pattern made of the insulation pattern over the active layer;
- performing an ashing process for removing part of the first photoresist film pattern to form a predetermined second photoresist film pattern on the insulation film pattern; and
- selectively removing part of the insulation film pattern using the second photoresist film pattern as a mask to form a channel protection layer made of the insulation layer on the substrate.

9. The method of fabricating an oxide thin-film transistor of claim 1, wherein the step of forming the active layer and channel protection layer comprises,
- forming a first photoresist film pattern having a first thickness and a second photoresist film pattern and a third photoresist film pattern having a second thickness on the substrate using a diffraction mask for which a diffraction pattern is applied to the source/drain regions of the active layer;
- selectively patterning the amorphous zinc oxide-based semiconductor layer using the first photoresist film pattern through third photoresist film pattern as a mask to form an active layer made of the amorphous zinc oxide-based semiconductor over the gate electrode;
- removing the second photoresist film pattern and third photoresist film pattern while at the same time removing part of the thickness of the first photoresist film pattern to form a fourth photoresist film pattern having a third thickness; and
- selectively patterning the insulation layer using the fourth photoresist film pattern as a mask to form a channel protection layer on a channel region of the active layer.

10. The method of fabricating an oxide thin-film transistor of claim 1, wherein the active layer and channel protection layer are etched at the same time and the source/drain electrodes thereon are brought into contact with a lateral surface of the active layer.

* * * * *